(12) United States Patent
Hell

(10) Patent No.: US 7,539,115 B2
(45) Date of Patent: May 26, 2009

(54) CREATING A PERMANENT STRUCTURE WITH HIGH SPATIAL RESOLUTION

(75) Inventor: Stefan Hell, Göttingen (DE)

(73) Assignee: Max-Planck-Gesellschaft zur Förderung der Wissenschaften e.V., München (DE)

( * ) Notice: Subject to any disclaimer, the term of this patent is extended or adjusted under 35 U.S.C. 154(b) by 815 days.

(21) Appl. No.: 11/249,103

(22) Filed: Oct. 12, 2005

(65) Prior Publication Data

US 2006/0044985 A1 Mar. 2, 2006

Related U.S. Application Data

(63) Continuation of application No. PCT/EP2004/003768, filed on Apr. 8, 2004, and a continuation-in-part of application No. 10/420,896, filed on Apr. 22, 2003, now Pat. No. 7,064,824.

(30) Foreign Application Priority Data

Apr. 13, 2003 (DE) ................. 103 17 613
Jun. 5, 2003 (DE) ................. 103 25 459

(51) Int. Cl.
*G11B 7/00* (2006.01)
*G01J 3/30* (2006.01)

(52) U.S. Cl. .............. 369/100; 369/13.01; 356/317; 356/458.1

(58) Field of Classification Search ............. None
See application file for complete search history.

(56) References Cited

U.S. PATENT DOCUMENTS

| 3,712,813 A | 1/1973 | Ross et al. ................ 96/27 |
| 4,104,070 A | 8/1978 | Moritz et al. .............. 96/36 |
| 5,268,862 A | 12/1993 | Rentzepis ............... 365/151 |

(Continued)

FOREIGN PATENT DOCUMENTS

DE 10012462 A1 9/2001

(Continued)

OTHER PUBLICATIONS

Lukyanov, et al., "Natural Animal Coloration Can be Determined by a Nonfluorescent Green Fluorescent Protein Homolog", The Journal of Biological Chemistry, vol. 275, No. 84, pp. 25879-25882 (2000).

(Continued)

*Primary Examiner*—Muhammad N. Edun
(74) *Attorney, Agent, or Firm*—Thomas, Kayden, Horstemeyer & Risley, LLP

(57) ABSTRACT

In a method of creating a permanent structure with high spatial resolution, a substance which may be modified by an optical signal is provided in a writing area. The optical signal is applied to the writing area in such a way that a spatially limited partial area of the writing area is purposefully omitted, the spatially limited partial area being a local intensity minimum of the optical signal, and the optical signal, outside of the spatially limited partial area, being applied to the writing area in such a way that saturation is achieved in modifying the substance with the optical signal. Then, different states of the substance in the spatially limited partial area and of the substance in the partial areas of the writing area covered by the optical signal are permanently adjusted.

33 Claims, 3 Drawing Sheets

U.S. PATENT DOCUMENTS

| | | | | |
|---|---|---|---|---|
| 5,403,435 | A | 4/1995 | Cathey et al. | 156/643 |
| 5,731,588 | A | 3/1998 | Hell et al. | 250/458.1 |
| 5,936,878 | A | 8/1999 | Arsenov | 365/111 |
| 6,632,546 | B2* | 10/2003 | Suwabe et al. | 369/286 |
| 6,803,777 | B2* | 10/2004 | Pfaff et al. | 324/752 |
| 2001/0042837 | A1 | 11/2001 | Hoffmann | 250/458.1 |

FOREIGN PATENT DOCUMENTS

| | | |
|---|---|---|
| WO | WO 95/21393 | 8/1995 |
| WO | WO 98/31018 | 7/1998 |
| WO | WO 01/94384 A2 | 12/2001 |

OTHER PUBLICATIONS

Dickson, et al., "On/Off Blinking and Switching Behaviour of Single Molecules of Gren Fluorescent Protein", Nature, vol. 388, pp. 355-358 (1997).

"A Digital Fluorescent Molecular Photoswitch", Nature, vol. 420, pp. 759-760 (2002).

Hell, Stefan W., "Increasing the Resolution of Far-Field Fluorescence Light Microscopy by Point-Spread-Function Engineering", Topics in Fluorescence Microscopy; vol. 5, Nonlinear and Two-Photon-Induces Fluorescence; edited by L. Lakowitz, Pelnum Press New York, pp. 361-426 )1997).

Dyba, et al., "Focal Spots of Size $\lambda/23$ Open p Far-Field Florescence Microscopy at 33 nm Axial Resolution", Physical Review Letters, vol. 88, No. 16, Apr. 22, 2002 (The American Physical Society, pp. 163901-1 to 163901-4.

Cinelli, et al., "Green Fluorescent Proteins as Optically Controllable Elements in Bioelectronics", Applied Physics Letters, vol. 79, No. 20, Nov. 12, 2001, pp. 3353-3355.

Dvornikov, et al., Write, Read, Erase Materials for 3D Optical Memory Devices, Part of the SPIE Conferene on Advanced Optical Data Storage: materials. Systems, and Interfaces to Computers, Denver, CO Jul. 1999, vol. 3802, pp. 192-200.

* cited by examiner

CREATING A PERMANENT STRUCTURE WITH HIGH SPATIAL RESOLUTION

CROSS REFERENCE TO RELATED APPLICATIONS

This application is a continuation of International Application PCT/EP2004/003768 with an International Filing Date of Apr. 8, 2004 and claiming priority to co-pending German Patent Application No. 103 17 613.6 entitled "Räumlich hochauflösendes Abbilden und Modifizieren von Strukturen", filed on Apr. 13, 2003, to co-pending U.S. patent application Ser. No. 10/420,896 entitled "High spatial Resolution Imaging and Modification of Structures", filed on Apr. 22, 2003, and to co-pending German Patent Application No. 103 25 459.5 entitled "Räumlich hochaufgelöstes Erzeugen einer dauerhaften Struktur", filed on Jun. 5, 2003.

This application is a continuation-in-part of the aforesaid U.S. application Ser. No. 10/420,896 entitled "High spatial Resolution Imaging and Modification of Structures", filed on Apr. 22, 2003 now U.S. Pat. No. 7,064,824.

FIELD OF THE INVENTION

This invention relates to a method of creating a permanent structure with high spatial resolution by using an optical signal. Particularly, the invention relates to method of creating a permanent structure with high spatial resolution, the method comprising the steps of providing a substance, which may be modified by an optical signal, in a writing area; of applying the optical signal to the writing area in such a way that a spatially limited partial area of the writing area is purposefully omitted; and of permanently adjusting different states of the substance in the spatially limited partial area and in the partial areas of the writing area covered by the optical signal. Further, the invention relates to an apparatus having a writing area adapted to be permanently modified by means of an optical signal. Particularly, the invention can be applied in writing into an optical data storage and in formation of microlithographic structures.

The permanence of the structure created by the new method or with the new apparatus shall be given for a period of time which is at least much longer than one minute and which is preferably much longer than one day; even more preferably the created structure remains up to a point in time at which it is purposefully amended or deleted, so that the structure can also be used during a very long interval of time after its creation.

DESCRIPTION OF RELATED ART

In a known method of creating a permanent structure with high spatial resolution by using an optical signal, in which an apparatus having a writing area adapted to be permanently structured by means of an optical signal is used, a coating of photoresist is exposed to an optical signal everywhere where the coating of photoresist is to be permanently modified. Here, the desired structure does not consist of the modified partial areas of the writing area but of partial areas purposefully omitted with the optical signal.

The spatial resolution both of imaging optical methods and of modifying optical methods is in principle set by the diffraction limit (Abbe's limit) at the respective wave length of the relevant optical signal.

Thus, in all known methods of creating a permanent structure with high spatial resolution by using an optical signal the diffraction barrier is the natural lower limit of the resolution, for example in writing data into an optical data storage and thus of the data density obtainable in the data storage, and in microlithography. Up to know, it is necessary to use light of shorter wavelength to create finer structures, like for example in a photoresist. At present, deep-UV light is used; for the future, it is desired to use x-rays. One problem of this tendency towards shorter wavelengths is that light of a wavelength of less than 250 nm is hard to focus, and that the required lenses become more and more expensive and inefficient.

In the field of fluorescence microscopy, however, methods are already known by which the spatial resolution in imaging a structure of a sample is effectively enhanced beyond the diffraction limit by making use of a non-linear relationship between the sharpness of the definition of the effective focal spot and the input intensity of an optical excitation signal. Examples for these methods include multi-photon absorption in a sample and generation of higher harmonics of input light. Saturation of an optically induced transfer may also be used as a non-linear relationship, like, for example, in case of stimulated emission depletion (STED) of the fluorescent state, and of ground state depletion (GSD).

In both of these known methods, which can in principle achieve a molecular resolution, a fluorescence dye, by which the structure of interest of a sample is marked, is transferred into an energy state, from which no fluorescence is (still) possible, everywhere where an optical signal exceeds a characteristic threshold value, which will be referred to as the saturation threshold value in this description. If the spatially limited area, out of which a measurement signal is still registered, is defined by an intensity minimum of the optical signal, which has a zero intensity point and which is, for example, produced by interference, the dimensions of the spatially limited area and thus the achieved spatial resolution are smaller than the diffraction limit. The reason for this is that the spatially limited partial area out of which the measurement signal is registered is delimited with an increasing level of saturation of the depletion of the energy state involved in fluorescence. In the same way, the edge of a focal spot or stripe becomes steeper, which also results into an increased spatial resolution.

A particular STED method is known from WO 95/21393 A1. In this method, a sample or a fluorescence dye, by which a structure of interest within the sample is marked, is excited for fluorescence by means of an exciting beam. The spatially limited area of the excitation, to which the diffraction limit normally applies, is then reduced in that it is superimposed with an intensity minimum of an interference pattern of an optical stimulation signal. Everywhere, where the optical stimulation signal exceeds a saturation threshold value, the fluorescence dye is at least essentially completely switched off by stimulated emission, i.e. it is brought down from the previously excited energy state. The remaining spatially limited area out of which fluorescence light is still spontaneously emitted afterwards only correspond to a reduced area around the center of the intensity minimum in which the stimulation signal was not present or not present with a sufficient intensity.

From The Journal of Biological Chemistry, Vol. 275, No. 84, pages 25879-25882 (2000) a protein is known which can increasingly be excited for fluorescence in a red range by means of green light, but which looses its fluorescence properties upon exposition to blue light. This process is reversible. It looks like that the green light switches the protein to a state of conformation in which it has the fluorescence property, and at the same times excites the fluorescence; whereas the blue light switches the protein into a state of conformation without the fluorescence property. The protein is a protein naturally occurring in the sea anemone anemonia sulcata, the functions of which described here may be purposefully enhanced by exchanging amino acids.

Further, it is known from Nature Vol. 388 pages 355-358 (1997) that the green fluorescent protein (GFP) and mutants thereof may be switched between two states one of which differs from the other in a spectral aspect.

Both proteins mentioned here could be used as a fluorescence marker in living cells.

From Nature, Vol. 420 pages 759-760 (2002) fluorescent molecules from the family of diarylethenes are known which may be deliberately switched between a fluorescent and a non-fluorescent state. Both states are thermally stable so that the switching process can be accomplished at comparatively low intensities. In this case, the switching process is a photoisomerization. Such molecules can also be referred to as photochromic.

There is a particular need for a method which enables surpassing the diffraction barrier in creating a permanent structure with high spatial resolution by using an optical signal. Further, there is a need of an apparatus suitable for carrying out such a method.

BRIEF SUMMARY OF THE INVENTION

In one aspect, the invention provides a method of creating a permanent structure with high spatial resolution, the method comprising the steps of providing a substance, which may be modified by an optical signal, in a writing area; of applying the optical signal to the writing area in such a way that a spatially limited partial area of the writing area is purposefully omitted, the spatially limited partial area being a local intensity minimum of the optical signal, and the optical signal, outside of the spatially limited partial area, being applied to the writing area in such a way that saturation is achieved in modifying the substance with the optical signal; and of permanently adjusting different states of the substance in the spatially limited partial area and of the substance in the partial areas of the writing area covered by the optical signal.

In another aspect, the invention provides an apparatus having a writing area adapted to be permanently modified by means of an optical signal, wherein the substance is selected from a group of substances which are adapted to be repeatedly transferred with the optical signal out of a first state having first optical properties into a second state having second optical properties differing from the first optical properties, which are adapted to be returned out of the second state into the first state, and which are adapted to be permanently transferred by a writing signal into an amended state out of the first state only.

BRIEF DESCRIPTION OF THE DRAWINGS

In the following the invention is further explained and described by means of preferred embodiments, details of which are shown in the attached drawings.

DETAILED DESCRIPTION OF THE INVENTION

Figure 1:
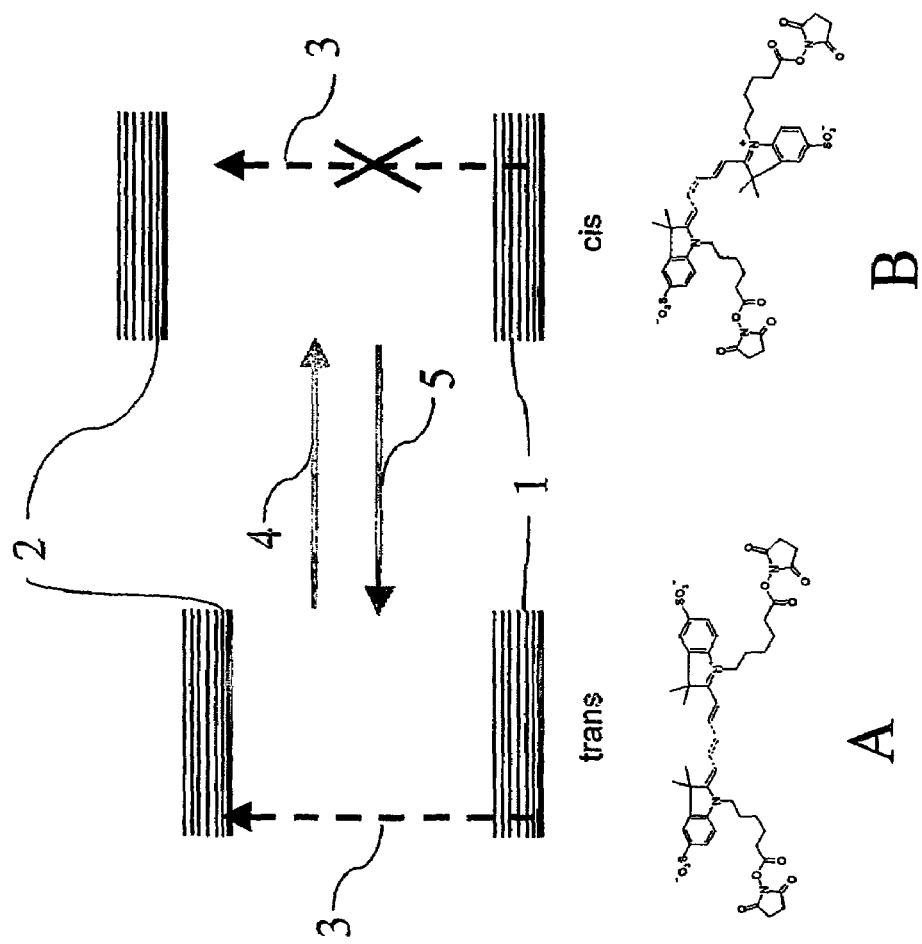
FIG. 1 symbolically shows two different states of a molecule which may be used in an embodiment of the new method.

In the new method, the spatially limited partial area, which is purposefully omitted with the optical signal and in which no or at least essentially no modification of the substance by the optical signal occurs, is a local intensity minimum of the optical signal. Additionally, the optical signal, outside of the spatially limited partial area, is applied to the writing area at such an intensity that saturation is achieved in modifying the substance with the optical signal. As a result the dimensions of the spatially limited partial area, in which the substance is not modified by the optical signal, are smaller than the diffraction barrier.

In the new method, the local intensity minimum of the optical signal is provided by a light interference process. The term light interference process is to be interpreted very broadly here. It does not only cover the superposition of two or even more beams of coherent light. For example, the interference effects occurring upon focusing a single beam of coherent light may also be used.

Saturation in modifying the substance with the optical signal is achieved in that the optical signal, outside of the spatially limited partial area, is applied to the writing area at an intensity above a saturation threshold value above which the substance is completely or at least essentially completely modified by the optical signal. It should be noted that, for surpassing the diffraction barrier, the saturation threshold value is not only to be reached at the place of any intensity maxima which are neighbouring the intensity minimum in the spatially limited partial area. Instead, the saturation threshold value has also to be exceeded in the direct neighbourhood of the local intensity minimum to effectively surpass the diffraction barrier. This can be achieved by increasing the intensity of the optical signal.

The new method can be used to create one-, two- or even three-dimensional structures in the writing area. A one-dimensional structure is a structure along a single line or a structured line; a two-dimensional structure is a structure in a single plane or a structured plane; and a three-dimensional structure is a structure within a volume or a structured volume. It is clear that the writing area has to be designed and provided with the substance in accordance with the desired dimensionality of the structure. Preferably, the substance is homogenously or systematically distributed over the writing area to care for uniform conditions in the whole writing area.

To the end of completely creating the structure in the writing area, it is intended to scan the writing area with the spatially limited partial area purposefully omitted by the optical signal. As the structure may be simultaneously created in a plurality of distant points, i.e. in a plurality of spatially limited partial areas, the writing area may also be scanned with a plurality of plurality of spatially limited partial areas purposefully omitted by the optical signal at the same time. In this way, the total time needed for creating the respective structure is reduced.

As each spatially limited partial area omitted by the optical signal is an intensity minimum of an interference pattern, scanning can be accomplished by movement of one intensity minimum or of a plurality of interference minima of the optical signal. This movement may be accomplished by a phase shift of the interfering beams.

In the new method, the optical signal may directly be the writing signal by which the desired structure is created. To this end, the substance is to be selected from a group of substances which are adapted to be permanently transferred out of a starting state into an amended state by the optical signal. Then, the spatially limited partial areas purposefully omitted by the optical signal constitute the desired structure having a spatial resolution surpassing the diffraction barrier. Surpassing the diffraction barrier is not only achieved, when the created structure has dimensions below the diffraction barrier, but also, when the transitions of the structure are sharper than normally dictated by the diffraction barrier. Particularly, data points, which display a particular sharpness and small dimensions whereas their distance is still limited by the diffraction barrier, can be written into an optical data storage in this particular embodiment of the new method, in which the optical signal is directly used as a writing signal.

In a second general embodiment of the new method, even the distance of such data points may be made smaller than the diffraction barrier. To this end, the substance is to be selected from a group of substances which are adapted to be repeatedly transferred with the optical signal out of a first state having first properties into a second state having second properties differing from the first properties, which are adapted to be returned out of the second state into the first state, and which are adapted to be permanently transferred by a writing signal into an amended state out of the first state only. I.e. the optical signal is not yet the writing signal which is here separately applied to the writing area. Instead, the optical signal is used to bring the substance into that state which is here denoted as the second state and out of which no permanent amendment of the substance by the writing signal occurs. The just temporary transfer of the substance out of its first state into its second state by means of the optical signal is a precondition for surpassing the diffraction barrier even with regard to the distance of the details of the created structure in this embodiment of the new method. The structure is only amended by the writing signal in a partial area which has smaller dimensions than the diffraction barrier. Whether further amendments are made in the surrounding of this partial area, is not yet decided here. It is not essential that the first and second properties of the substance in its first and second state are "binary", i.e. it is not necessary that they are each present in the one state at 100% and in the other state at 0%. Instead, it is sufficient, if the properties of the two states of the substance are different with regard to the writing signal to such an extent that the writing signal is clearly associated with the first state so that essentially only the substance in its first state is permanently amended by the writing signal.

In a preferred variant of the second embodiment of the new method, the writing signal, which is applied in addition to the optical signal, also is an optical signal. In this case, the first and second properties of the substance in its first and second state also include different optical properties, only the first properties of which support the optical writing signal. The writing signal may also belong to the non visible part of the electromagnetic spectrum, for example to the far infrared or to the microwave part. Electro-magnetic radiation having a wavelength of less than 250 nm may also be used as an optical writing signal. In any case, the advantage over the prior art remains that it is not necessary to focus the writing signal to that partial area which is to be permanently amended within the writing area, because the partial areas to be permanently amended are spatially defined via the spatial definition of the second state of the substance by means of the optical signal. Thus, the writing signal may also be a non-electro-magnetic signal, like for example a thermal or chemical signal.

Substances having two different states with different properties which are suitable for the new method may be selected from a sub-group of substances in which the two states having the different properties are different states of conformation of a molecule or of a group of molecules, or display different chemical bonds. The substances may also be selected from a sub-group of substances which are adapted to be transferred between the two states by photoisomerization or photocyclization. Correspondingly, the optical signal may, in the substance, cause a rearrangement of bonds or atom groups, a cis-trans isomerization, a cyclization reaction, a protonation or de-protonation, a spinflip, a change in orientation of molecules or molecule groups, and/or an electron transfer and/or an energy transfer between interconnected molecules or molecule sub-units.

One big advantage of the new method is that the two states with the first and the second properties of several suitable substances have a life time which is several times longer than the energy states typically involved in fluorescence of a fluorescence dye. Further, the intensities which are necessary for achieving the saturation of a change of confirmation are comparatively small. Changes of state in which the starting state and/or the end state have a comparatively long life time (of more than 100 ns) may be effected with comparatively small intensities of the optical signal. The required intensities become lower with the life times of the states becoming longer.

Preferably, such substances are used in the second embodiment of the new method which may be transferred out of the second into the first state by means of a switching signal. By means of the other switching signal, the transfer of the substance with the optical signal into the second state can purposefully be reversed. The switching signal may be an optical switching signal. It may, however, also be an electric or thermal signal, or a signal belonging to the non-optical part of the electromagnetic spectrum. Further, it is possible, that the substance spontaneously returns into the first state, i.e. thermally driven at room temperature. For example, it is known that molecules which undergo a photo-induced cis-transisomerization can simply thermally return to their first state. By means of the switching signal, however, which purposefully returns the substance to the first state, the method may normally be accelerated or at least be more precisely controlled.

To the end of avoiding undesired interactions between the different signals in the second embodiment of the new method, it is preferred if the permanent transfer of the substance into the amended state by the writing signal may be reversed neither by the optical signal nor by the switching signal.

The switching signal is applied to the writing area prior to optical signal, or, if the successful transfer of the substance into the second state by means of the optical signal is not essentially affected by switching signal, at the same time as the optical signal. Particularly it is not required to limit the switching signal to the spatially limited partial areas of the writing area in which the structure is presently created. In the new method, the spatial limitation in creating the structure is provided by the optical signal.

The writing signal which also needs not to be restricted to the spatially limited partial areas of the writing area to be amended is applied to the writing area after or at the same time as the optical signal. In case of a simultaneous application, it has again to be cared for that no mutual disturbance must occur.

Although, as mentioned previously, the signals may overlap, the understanding of the second embodiment of the new method is enhanced upon considering the following sequences of signals which are cyclically repeated. The substance in the writing area is in its first state. In partial areas of the writing area the substance is transferred into its second state by means of the optical signal. Doing this, the spatially limited partial area in which the substance is to be permanently amended is omitted, and thus the substance within the spatially limited area is still in its first state. Next, the substance is amended by means of the writing signal to permanently get into its amended state within the spatially limited partial area. After this, the substance in the writing area is returned to its first state. This may be done by means of the switching signal. Afterwards, the cycle begins again but at another point of the writing area. In case of an only weakly localized writing signal, the optical signal transferring the substance into its second state in which it is not sensitive for the writing signal has also to cover large areas of the writing area. This is not necessary with a more localized writing signal. The point in time at which the single signals are present is defined by certain intensities of the signals being reached. Thus, the signals may also be periodically modulated over the time to realize the cyclic sequence of the signals.

The substance, for example, may be selected from the group of proteins. This group particularly includes the known proteins asCP (asFP595) and T70A/A148S/S165V which have two conformational states with different optical properties, and also the green fluorescent protein (GFP) and mutants derived thereof.

The permanent transfer of the substance into its amended state may be reversible or irreversible. If it is reversible, reversion should be effected neither by the switching signal nor by any other signal used in the original amendment. Instead, a further signal having totally other properties should be required for reversion of the amendment.

If the amended state of the substance into which it is permanently transferred according to the new method is an amended optical property of a group including absorption, diffraction and polarization, or an amended luminescence of a group including fluorescence, phosphorescence, electro-luminescence and chemo-luminescence, the created structure may be read out by means of a probe beam.

Upon making full use of the opportunities of the present invention, data may be written according to the new method into an optical data storage at a particularly high data density which is no longer delimited by the diffraction barrier. Similarly, micro and nano structures may be written or created with a spatial resolution surpassing the diffraction barrier.

The new apparatus according to the invention can be used for implementing the second embodiment of the new method, and it is particularly suited as an optical data storage.

The attached Figures which are discussed in the following are particularly related to the second embodiment of the new method.

FIG. 1 shows structure formulas and energy states of a molecule which can be in two different states A and B. Out of state A, which is also denoted as the first state in the preceding description and the attached claims, the molecule may be permanently transferred into an amended state which is not depicted here by means of a writing signal 3. This permanent amendment of the substance is not possible out of state B, which is also denoted as the second state in the preceding description and the attached claims. Particularly, the writing signal here transfers the molecule within its state A out of an energetic ground state 1 into an energetic excited state 2 out of which it permanently gets into the amended state not depicted here. The states A and B are two isomers (cis and trans) of a molecule which may be transferred out of its state A into its state B by photoisomerization caused by an optical signal 4, and out of state B back into state A also by means of an optical switching signal 5. In state B, the writing signal 3 does not result into a permanent amendment to the substance, as the excited energetic state 2 which is at a higher energy level here is not reached.

Figure 2:
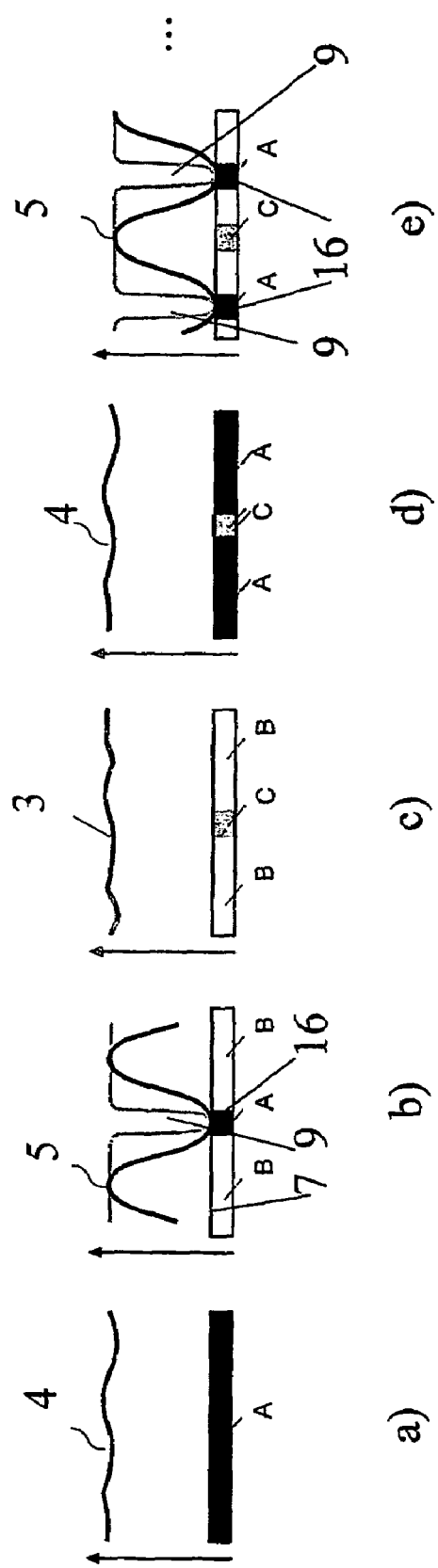
FIG. 2 shows an exemplary cyclic sequence of signals in the embodiment of the invention for which the molecule of FIG. 1 is suited.

FIG. 2 shows a preferred cyclic sequence of the signals, i.e. of the optical signal 4, of the switching signal 5 and of the writing signal 3. Besides the states A and B the permanently amended state C of the present substance is also indicated here in parts c) to e) of FIG. 2. The sequence shown in the parts of FIG. 2 is: a) The switching signal 4 switches the substance into its writable state A. b) The optical signal 5 having at least one local intensity minimum 9 is applied to the writing area 7, and switches the substance out of its state A into its state B everywhere outside the intensity minimum 9. Because of the saturation of the switch process, the spatially limited partial area in which the substance still remains in its state A is reduced to dimensions which are only dependent on the level of saturation and of the original steepness and width of the intensity minimum. c) The writing signal 3 transfers the substance being in state A but not in state B permanently into state C. d) The switching signal 4 switches the substance which has not been transferred into state C back into state A. e) The optical signal 5 is applied again, the zero intensity point 16 of the at least one intensity minimum 9 being positioned at another point of the writing area 7.

Figure 3:
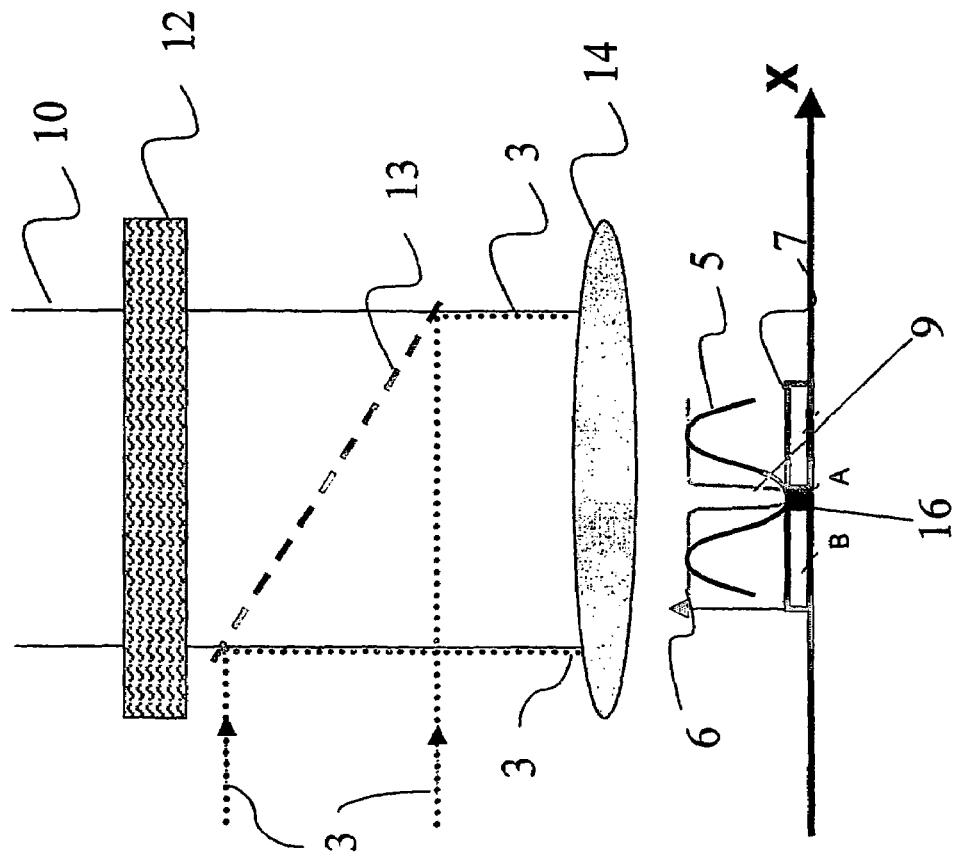
FIG. 3 schematically shows a device for carrying out the invention.

FIG. 3 schematically shows a suitable device for carrying out the invention. Optical beams 10 of the optical signal 5 are deformed by means of a wave front modulator 12 in such a way that they form an interference pattern having an intensity minimum 9 with a zero intensity point 16 in the writing area 7 after passing a dichroic mirror 13 and a lens 14. The optical signal saturates the transition 6 from state A to state B so that only a sub-diffraction area of substance in state A remains along the coordinate X depicted here. The writing signal 3 which is applied to the writing area 7 via the dichroic mirror 13 and the lens 14 transfers the substance being in state A permanently into the amended state C.

Many variations and modifications may be made to the preferred embodiments of the invention without departing substantially from the spirit and principles of the invention. All such modifications and variations are intended to be included herein within the scope of the present invention, as defined by the following claims.

I claim:

1. A method of creating a permanent structure with high spatial resolution, the method comprising the steps of:
    providing a substance, which may be modified by an optical signal, in a writing area;
    applying the optical signal to the writing area in such a way that a spatially limited partial area of the writing area is purposefully omitted, the spatially limited partial area being a local intensity minimum of the optical signal, and the optical signal, outside of the spatially limited partial area, being applied to the writing area in such a way that saturation is achieved in modifying the substance with the optical signal; and
    permanently adjusting different states of the substance in the spatially limited partial area and of the substance in the partial areas of the writing area covered by the optical signal.

2. The method of claim 1, wherein the local intensity minimum of the optical signal has a zero intensity point.

3. The method of claim 2, wherein the local intensity minimum of the optical signal is provided by an interference of light.

4. The method of claim 1, wherein the optical signal, outside of the spatially limited partial area, being applied to the writing area at an intensity above a saturation threshold value above which the substance is essentially completely modified by the optical signal.

5. The method of claim 1, wherein a one-dimensional structure is created in the writing area by means of permanently adjusting different states of the substance in the spatially limited partial area and in the partial areas of the writing area covered by the optical signal.

6. The method of claim 1, wherein a two-dimensional structure is created in the writing area by means of permanently adjusting different states of the substance in the spatially limited partial area and in the partial areas of the writing area covered by the optical signal.

7. The method of claim 1, wherein a three-dimensional structure is created in the writing area by means of permanently adjusting different states of the substance in the spatially limited partial area and in the partial areas of the writing area covered by the optical signal.

8. The method of claim 1, wherein, in the step of providing, the substance is homogenously distributed over the writing area.

9. The method of claim 1, wherein, in the step of providing, the substance is systematically distributed over the writing area.

10. The method of claim 1, wherein the writing area is scanned with the partially limited area purposefully omitted by the optical signal.

11. The method of claim 10, wherein the writing area is scanned with a plurality of partially limited areas purposefully omitted by the optical signal at the same time.

12. The method of claim 1, wherein the substance is selected from a group of substances which are adapted to be permanently transferred out of a starting state into an amended state by the optical signal.

13. The method of claim 1, wherein the substance is selected from a group of substances which are adapted to be repeatedly transferred with the optical signal out of a first state having first properties into a second state having second properties differing from the first properties, which are adapted to be returned out of the second state into the first state, and which are adapted to be permanently transferred by a writing signal into an amended state out of the first state only.

14. The method of claim 13, wherein the writing signal is an optical writing signal.

15. The method of claim 14, wherein the substance is selected from a sub-group of substances in which the two states having the different properties are different states of conformation of a molecule or of a group of molecules, or display different chemical bonds.

16. The method of claim 14, wherein the substance is selected from a sub-group of substances which are adapted to be transferred between the two states by means of photoisomerization or photocylization.

17. The method of claim 14, wherein the substance is selected from a sub-group of substances which are adapted to be transferred out of the second state into the first state by means of a switching signal.

18. The method of claim 17, wherein the switching signal is an optical switching signal.

19. The method of claim 17, wherein the permanent transfer of the substance into the amended state by the writing signal is reversed neither by the optical signal nor by the switching signal.

20. The method of claim 17, wherein the switching signal is applied to the writing area essentially prior to optical signal.

21. The method of claim 17, wherein the switching signal is applied to the writing area essentially at the same time as the optical signal.

22. The method of claim 14, wherein the writing signal is applied to partial areas of the writing area covered by the optical signal and to the spatially limited area omitted by the optical signal.

23. The method of claim 14, wherein the writing signal is applied to the writing area essentially after the optical signal.

24. The method of claim 14, wherein the writing signal is applied to the writing area essentially at the same time as the optical signal.

25. The method of claim 14, wherein the substance is selected from a sub-group of substances including proteins.

26. The method of claim 1, wherein the different states of the substance comprise different optical properties.

27. The method of claim 26, wherein the different states of the substance comprise different optical properties selected from a group including different absorption, diffraction and polarization properties.

28. The method of claim 1, wherein the different states of the substance comprise different luminescence properties selected from a group including different fluorescence, phosphorescence, electro-luminescence and chemo-luminescence properties.

29. The method of claim 1, wherein the writing area is the writing area of an optical data storage.

30. The method of claim 1, wherein the structure is a lithographic structure.

31. A method of creating a permanent structure with high spatial resolution, the method comprising the steps of:
   selecting a substance from a group of substances
      which are adapted to be repeatedly transferred with an optical signal out of a first state having first optical properties into a second state having second optical properties differing from the first optical properties,
      which are adapted to be returned out of the second state into the first state, and
      which are adapted to be permanently transferred by a writing signal into an amended state out of the first state only;
   providing the substance in a writing area;
   applying the optical signal to the writing area in such a way that a spatially limited partial area of the writing area is purposefully omitted,
      the spatially limited partial area being a local intensity minimum of the optical signal, and
      the optical signal, outside of the spatially limited partial area, being applied to the writing area in such a way that saturation is achieved in modifying the substance with the optical signal; and
   applying the writing to the writing area to permanently transfer the substance within the spatially limited partial area into the amended state.

32. An apparatus having a writing area adapted to be permanently modified by means of an optical signal, wherein the substance is selected from a group of substances which are adapted to be repeatedly transferred with the optical signal out of a first state having first optical properties into a second state having second optical properties differing from the first optical properties, which are adapted to be returned out of the second state into the first state, and which are adapted to be permanently transferred by a writing signal into an amended state out of the first state only.

33. The apparatus of claim 32, wherein the writing area is the writing area of an optical data storage.

* * * * *